(12) United States Patent
Karnik

(10) Patent No.: US 8,310,224 B2
(45) Date of Patent: Nov. 13, 2012

(54) AUTOMATIC CALIBRATION CIRCUIT

(75) Inventor: Kiran Karnik, Kernersville, NC (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 348 days.

(21) Appl. No.: 12/699,829

(22) Filed: Feb. 3, 2010

(65) Prior Publication Data

US 2011/0187345 A1     Aug. 4, 2011

(51) Int. Cl.
*G01R 35/00* (2006.01)
*G01R 31/40* (2006.01)

(52) U.S. Cl. ..................... 324/74; 324/764.01

(58) Field of Classification Search .. 324/762.01–762.1, 324/601, 691, 755.01–755.11, 76.11–76.27, 324/74; 438/14–18; 257/48
See application file for complete search history.

(56) References Cited

U.S. PATENT DOCUMENTS

| | | | |
|---|---|---|---|
| 6,388,449 B1 | 5/2002 | Ramsden | |
| 6,459,335 B1 | 10/2002 | Darmawaskita | |
| 6,492,831 B2 * | 12/2002 | Hashimoto | 324/762.01 |
| 7,054,776 B2 * | 5/2006 | Bradley et al. | 702/107 |

* cited by examiner

*Primary Examiner* — Tung X Nguyen

(74) *Attorney, Agent, or Firm* — Schwabe Williamson & Wyatt

(57) ABSTRACT

Embodiments of circuits, devices, and methods related to calibration circuits are disclosed. In various embodiments, a calibration circuit may be used for calibrating a power detector circuit. In various other embodiments, a calibration circuit may be used for calibrating a resistor module. Other embodiments may also be described and claimed.

20 Claims, 6 Drawing Sheets

AUTOMATIC CALIBRATION CIRCUIT

FIELD

Embodiments of the present disclosure relate generally to the field of circuits, and more particularly to automatic calibration circuits.

BACKGROUND

A power detector is used in a variety of applications, e.g., detecting power of communication signals transmitted by an antenna structure. An operation of the power detector may be affected by a change in temperature, a charge level of a battery unit supplying power to the power detector, process variations, and/or the like. Accordingly, it may be desirable to periodically calibrate the power detector.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
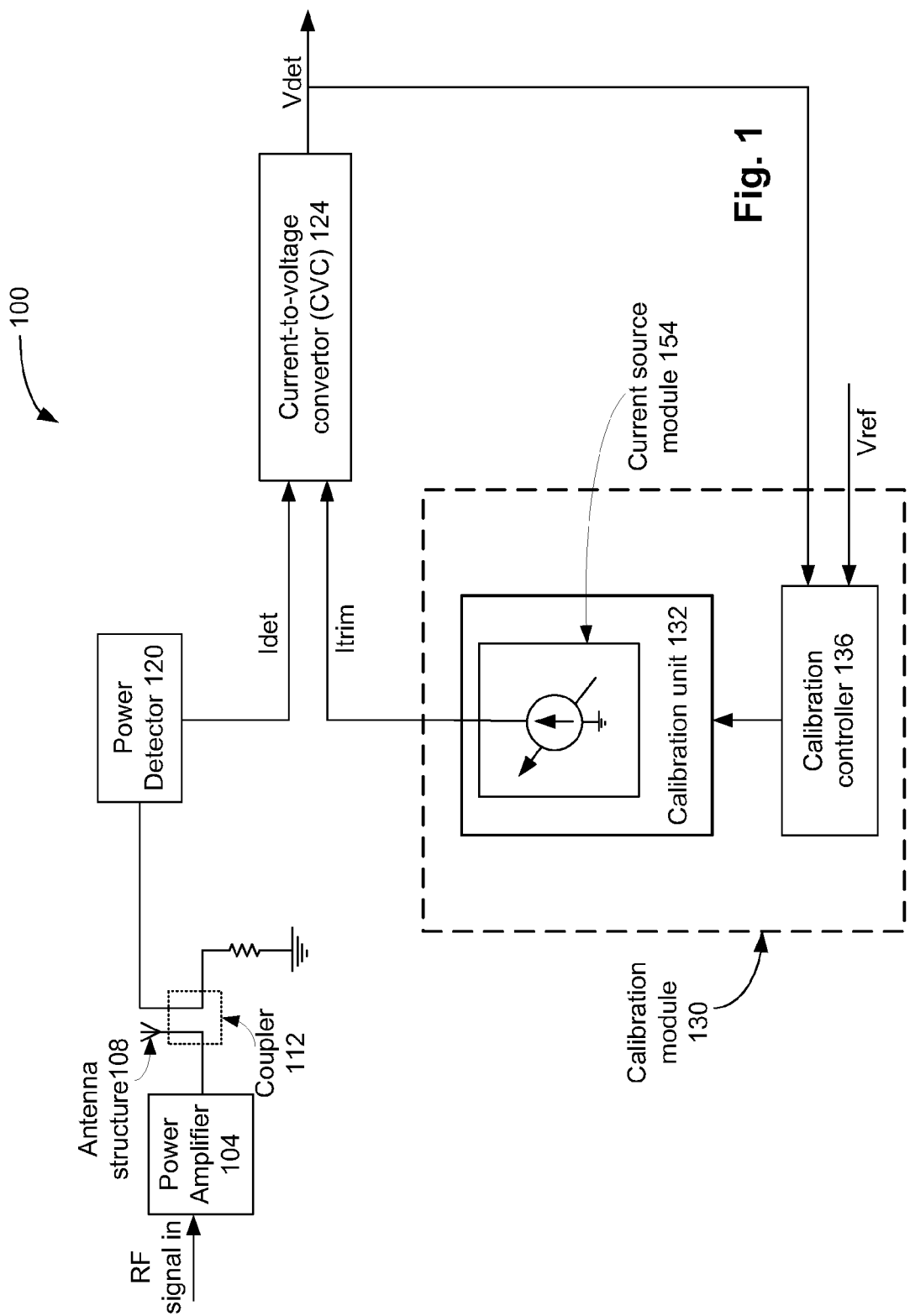
FIG. 1 schematically illustrates a system that includes a calibration module, in accordance with various embodiments of the present disclosure.

FIG. 1 schematically illustrates a system 100 that includes a calibration module 130, in accordance with various embodiments of the present disclosure. In various embodiments, the system 100 includes a power amplifier 104 that may be configured to receive RF signals, amplify the received RF signals, and transmit the amplified signals to an antenna structure 108 that is operatively coupled with the power amplifier 104. The antenna structure 108 may transmit the RF signals over a wireless medium.

In various embodiments, the antenna structure 108 may be operatively coupled with a coupler 112. The coupler 112 may transmit a derivative detection signal, which may be derived from the RF signals being transmitted to the antenna structure 108, towards a power detector 120 that is operatively coupled with the coupler 112. In various embodiments, the derivative detection signal may be a sample of the RF signal being transmitted to the antenna structure 108. Thus, based at least in part on the signals received from the coupler 112, the power detector 120 may detect power of RF signals being transmitted by the antenna structure 108. In various embodiments, the power detector 120 may be capable of detecting a power of RF signals transmitted through any of the bands of the antenna structure 108.

Although not illustrated in FIG. 1, in various embodiments, the output of the coupler 112 may be processed by one or more components (e.g., by a harmonic suppressor), before being transmitted to the power detector 120.

The power detector 120 may output a current Idet, where the current Idet may be representative of the derivative signal transmitted by the coupler 112. Thus, the current Idet may be representative of the power of RF signals transmitted by the antenna structure 108.

The system 100 also includes a current-to-voltage converter (CVC) 124 configured to receive the current Idet, and generate an output voltage Vdet based at least in part on the current Idet. In various embodiments, the output voltage Vdet may be representative of the power of RF signals transmitted by the antenna structure 108.

In various embodiments, the power detector 120 and/or the CVC 124 may have a relatively high gain, which may result in the output voltage Vdet being sensitive to the inputs of the power detector 120 and/or the CVC 124. The gain of the power detector 120 and/or the CVC 124 may be especially high when the RF power transmitted by the antenna structure 108 is relatively low.

In addition to being sensitive to the inputs of the power detector 120 and/or the CVC 124, the voltage Vdet may be influenced by various factors like operating temperature, power supply (e.g., which may depend on a charge level of a battery unit supplying power to the system 100), process variation (e.g., variation in manufacturing process of the power detector 120 and/or the CVC 124), and/or the like.

Accordingly, it may be desirable to periodically calibrate the power detector 120 and/or the CVC 124.

The system 100 may also include a calibration module 130 that includes a calibration unit 132 and a calibration controller 136. In various embodiments, the calibration unit 132 may include a current source module 154 to generate a current Itrim, which may be received by the CVC 124. The calibration controller 136 may be configured to receive the output voltage Vdet and a reference voltage Vref, and control an operation of the calibration unit 132, e.g., control generation of the current Itrim by the current source module 154.

In some embodiments, the calibration module 130 may be disposed in a single chip with the power detector 120, the CVC 124, and/or one or more other components of the system 100. In other embodiments, one or more components of the calibration module 130 may be disposed in a different chip compared to one or more other components of the system 100.

In various embodiments, the output voltage Vdet may be a function of the currents Idet and Itrim. For example, the output voltage Vdet may be equal to $f(\text{Idet}+\alpha.\text{Itrim})$, where $\alpha$ may be a weighting factor (e.g., $\alpha$ may be equal to 1) and the function $f$ may be any appropriate function based at least in part on the nature and settings of the CVC 124.

In various embodiments, the system 100 may operate at least in a calibration mode and in an operational mode. An operational mode of the system 100 may correspond to the antenna structure 108 transmitting RF communication signals. In various embodiments, the antenna structure 108 may transmit RF communication signals in a series of bursts.

In various embodiments, the system 100 may operate in a calibration mode for at least a period of time when the antenna structure 108 is not transmitting RF communication signals. While operating in the calibration mode, the calibration module 130 may calibrate the power detector 120 and/or the CVC 124.

In various embodiments, the system 100 may operate in the calibration mode periodically (e.g., in regular or irregular intervals). For example, the calibration module 130 may operate in the calibration mode before transmission of one or more bursts of RF communication signals by the antenna structure 108 and/or at a regular interval. In another example, the calibration module 130 may operate in calibration mode each time the system 100 is switched ON, reset, and/or initialized, in addition to (or instead of) operating in the calibration mode between one or more bursts of RF communication signals being transmitted by the antenna structure 108. In various embodiments, a calibration mode of operation may be followed by an operational mode of operation of the system 100.

In various embodiments, when the antenna structure 108 is not transmitting RF communication signals, the output current Idet of the power detector 120 may be relatively small. This small value of the current Idet may represent nominal output of the power detector 120, e.g., output of the power detector 120 with very small or no input received from the coupler 112. Also, when the antenna structure 108 is not transmitting RF communication signals, the current Itrim may be equal to a nominal value. The corresponding output Vdet of the CVC 124, e.g., corresponding to the nominal values of the currents Idet and Itrim, may also be relatively small.

In various embodiments, under pre-defined operating conditions and when the antenna structure 108 is not transmitting RF communication signals, the current Idet may be equal to a nominal current Idet_nom, the current Itrim may be equal to another nominal current Itrim_nom, and the corresponding output voltage Vdet may be equal to a nominal voltage Vnom. The pre-defined operating conditions may correspond to, for example, a pre-defined temperature, e.g., an average temperature, of the system 100, a pre-defined charge level, e.g., a full charge level, of a battery unit supplying power to the system 100, and/or the like. Under such pre-defined operating conditions and while the antenna structure 108 is not transmitting RF communication signals, for example, the current Idet_nom may be equal to about 20 micro-Amperes (mA), the current Itrim_nom may be equal to about 8 mA, and the corresponding voltage Vnom may be equal to about 0.2 Volts.

However, in various situations, the actual operating conditions of the system 100 may be different from the pre-defined operating conditions. For example, the actual operating temperature of the system 100 and the operating battery unit charge level may vary from the respective pre-defined values. Also, there may be process variations, e.g., variations that occur during various manufacturing processes, in one or more components of the system 100. Because of such factors, the actual values of current Idet and/or the output voltage Vdet of the system 100 may be different from the nominal current Idet_nom and/or the nominal voltage Vnom, respectively, while the antenna structure 108 is not transmitting RF communication signals. Such factors may also contribute to the system 100 generating voltage Vdet that is not an accurate representation of the RF power transmitted by the antenna structure 108 during the operational mode.

To overcome such factors, the system 100 may be calibrated during the calibration mode such that the output voltage Vdet is substantially equal to the nominal voltage Vnom.

In various embodiments, during the calibration mode, the calibration controller 136 may receive the output voltage Vdet and the reference voltage Vref, which may be equal to, for example, the nominal voltage Vnom. The calibration controller 136 may control the calibration unit 132 such that the output voltage Vdet is about the same as the reference voltage Vref. For example, the calibration controller 136 may control the current source module 154 to adjust the current Itrim to a first current value Itrim1 that, given a corresponding output current Idet of the power detector 120, results in the corresponding voltage Vdet being about the same as the reference voltage Vref.

The calibration may be complete when the current Itrim is adjusted to the first current value Itrim1 and the voltage Vdet is about same as the reference voltage Vref. When the system 100 operates in an operational mode, e.g., when the antenna structure 108 is transmitting RF communication signals, subsequent to such a calibration mode, the calibration unit 132 may continue to supply the current Itrim at the first value Itrim1. In various embodiments, the calibration unit 132 may continue to supply the current Itrim at the first value Itrim1 during operational mode(s) of the system 100 until the power detector 120 and the CVC 124 are recalibrated (e.g., calibrated once again) during another calibration mode.

In various embodiments, calibrating the system 100 by adjusting the current Itrim to the first value Itrim1, and continuing to supply the current Itrim at the first value Itrim1 during subsequent operational modes may ensure that the output voltage Vdet relatively accurately reflects the power of RF communication signals transmitted by the antenna structure 108 during the operational mode.

Figure 2:
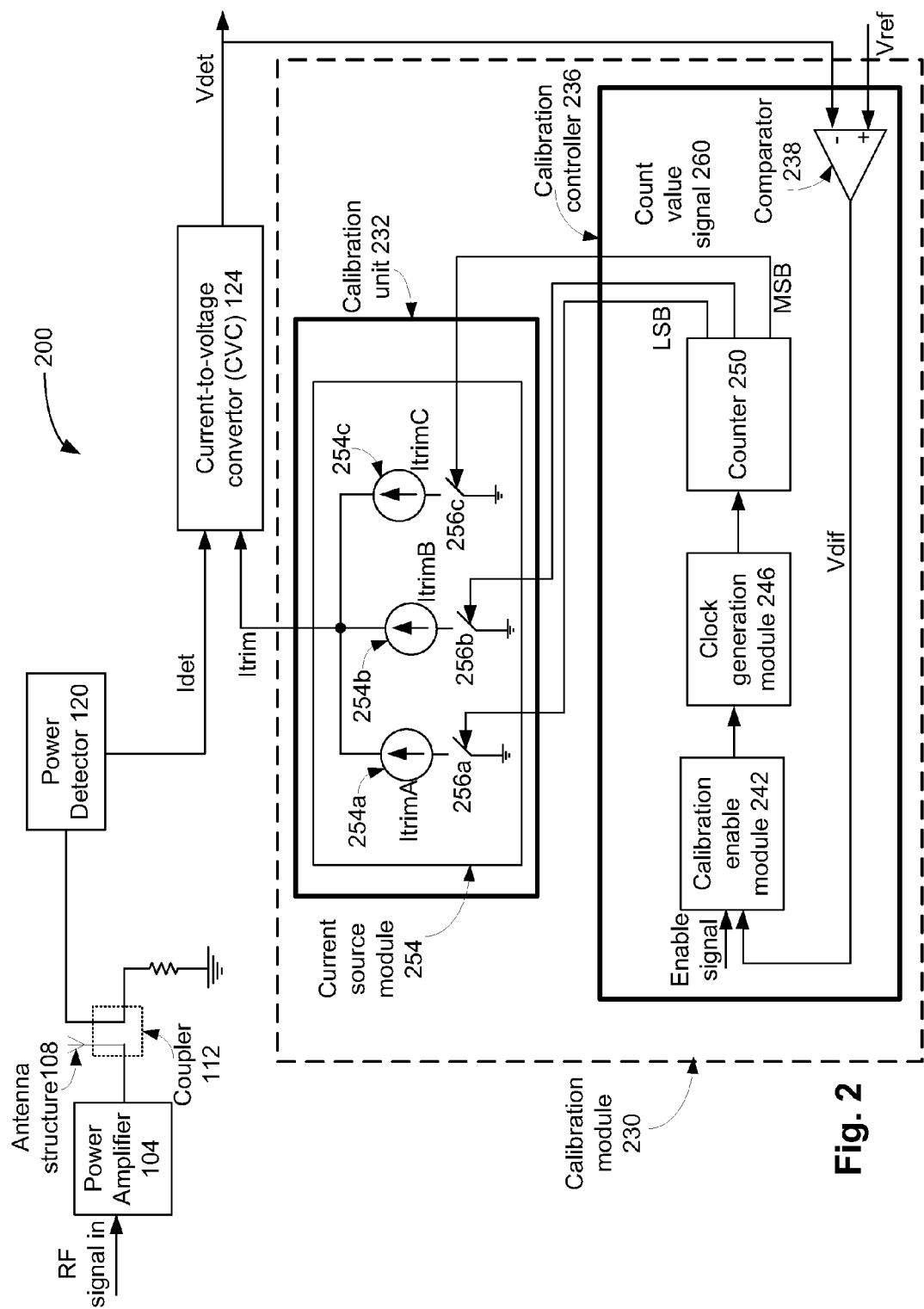
FIG. 2 schematically illustrates another system that includes another calibration module, in accordance with various embodiments of the present disclosure.

FIG. 2 schematically illustrates a system 200 that includes a calibration module 230, in accordance with various embodiments of the present disclosure. In various embodiments, one or more components of system 200, e.g., the power amplifier 104, antenna structure 108, coupler 112, power detector 120, and CVC 124, are similar to the corresponding components of the system 100 of FIG. 1.

In various embodiments, system 200 also includes a calibration module 230 comprising a calibration controller 236 and a calibration unit 232, all of which may operate at least in part in a similar manner compared to the corresponding components of system 100.

A current source module 254, which may be included in the calibration unit 232, comprises a plurality of current sources 254a, 254b and 254c. In various embodiments, the current Itrim output by the current source module 254 may be adjusted based at least in part on signals received from the calibration controller 236.

The calibration controller 236 may include a comparator 238 configured to compare the output voltage Vdet of the CVC 124 with the reference voltage Vref and output a signal Vdif that may be representative of a difference between the output voltage Vdet and the reference voltage Vref. In various embodiments, Vdif may be high, e.g., in a logic high state, if Vdet is less than Vref, i.e., if Vdet<Vref. Also, Vdif may be low, e.g., in a logic low state, if Vdet is greater than or equal to Vref, i.e., if Vdet≧Vref.

The calibration controller 236 may also include a calibration enable module 242 configured to receive the Vdif signal and an enable signal. The enable signal may be enabled, e.g., the enable signal is high, while the system 100 is in the calibration mode. The calibration enable module 242 is operatively coupled to a clock generation module 246. The clock generation module 246 is configured to generate a clock signal based at least in part on an output of the calibration enable module 242. For example, if the output of the calibration enable module 242 is high, the clock generation module 246 is enabled and generates the clock signal. On the other hand, if the output of the calibration enable module 242 is low, the clock generation module 246 is disabled and does not generate a clock signal.

In various embodiments, in case the enable signal is enabled and if Vdif is high, e.g., when Vdet is less than Vref, the output of the calibration enable module 242 is low. As previously discussed, such a low output of the calibration enable module 242 enables the clock generation module 246 to generate the clock signal.

On the other hand, in case the enable signal is disabled or if Vdif is low, e.g., when Vdet is equal to or greater than Vref, the output of the calibration enable module 242 is high. As previously discussed, such a high output of the calibration enable module 242 disables the clock generation module 246.

In various embodiments, the calibration enable module 242 may be a NAND logic gate. Accordingly, the output of the calibration enable module 242 is low if the enable signal is enabled, e.g., when the system 200 is in the calibration mode, and Vdif is high.

In various embodiments, the clock generation module 246 is operatively coupled to a counter 250. The counter 250 may be, for example, a ripple counter, although any other appropriate type of counter may also be used. During the calibration mode, the counter 250 may increment a count value signal 260 based at least in part on the clock generation module 246 generating the clock signal. For example, the counter 250 may increment the count value signal 260 by one for each clock pulse generated by the clock generation module 246.

In various embodiments, the count value signal 260 may be an N-bit signal, e.g., a signal comprising N bits. Also, the current source module 254 may comprise N number of current sources. Thus, a number of current sources included in the current source module 254 may be equal to a number of bits of the count value signal 260. In FIG. 2, the count value signal 260 is illustrated to be a 3-bit signal, e.g., N=3. Accordingly, the current source module 254 includes 3 current sources 254a, 254a and 254c. In various other embodiments, the count value signal 260 may include any other number of bits, and accordingly, the current source module 254 may include any other number of current sources.

In various embodiments, each of the current sources 254a, 254a and 254c may be configured to output, for example, currents ItrimA, ItrimB and ItrimC, respectively. The current Itrim may be equal to a sum of the outputs of the current sources 254a, 254b and 254c.

In various embodiments, the current sources 254a, . . . , 254c may be binary weighted current sources. For example, ItrimA may be equal to about $2^0$ (i.e., 1) times a reference current Itrim0, ItrimB may be equal to about $2^1$ (i.e., 2) times the reference current Itrim0, and ItrimC may be equal to about $2^2$ (i.e., 4) times the reference current Itrim0. In various other embodiments, the current sources 254a, . . . , 254c may be weighed in a different manner (e.g., weighted linearly).

The current sources 254a, 254b and 254c may be controlled by respective switches 256a, 256b and 256c. The switches 256a, 256b and 256c may be controlled by respective bits of the count value signal 260. For example, the least significant bit (LSB) of the count value signal 260 may control switching of the switch 256a, the most significant bit (MSB) of the count value signal 260 may control switching of the switch 256c, and the middle bit of the count value signal 260 may control switching of the switch 256b, as illustrated in FIG. 2.

For example, in case the count value signal 260 is 001, the switch 256a is switched ON, resulting in switching ON of the current source 254a only. Accordingly, Itrim may be equal to Itrim0. Table 1 below illustrates specific values of the count value signal 260, corresponding current sources that are switched ON, and corresponding values of Itrim. For example, for a count value signal 260 of 011, the switches 256a and 256b are switched ON, resulting in switching ON of the current sources 254a and 254b, and Itrim being equal to 3 times the reference current Itrim0. As illustrated in Table 1, the Itrim current is representative of, e.g., proportional to, the count value signal 260. For example, as the count value signal 260 is incremented, the current Itrim increases proportionally.

TABLE 1

| Count value signal 260 | Current Sources Switched ON | Itrim |
|---|---|---|
| 000 | None | 0 |
| 001 | Current source 254a | Itrim0 |
| 010 | Current source 254b | 2 times Itrim0 |
| 011 | Current sources 254a and 254b | 3 times Itrim0 |
| 100 | Current source 254c | 4 times Itrim0 |
| 101 | Current sources 254a and 254c | 5 times Itrim0 |
| 110 | Current sources 254b and 254c | 6 times Itrim0 |
| 111 | Current sources 254a, 254b and 254c | 7 times Itrim0 |

Figure 3:
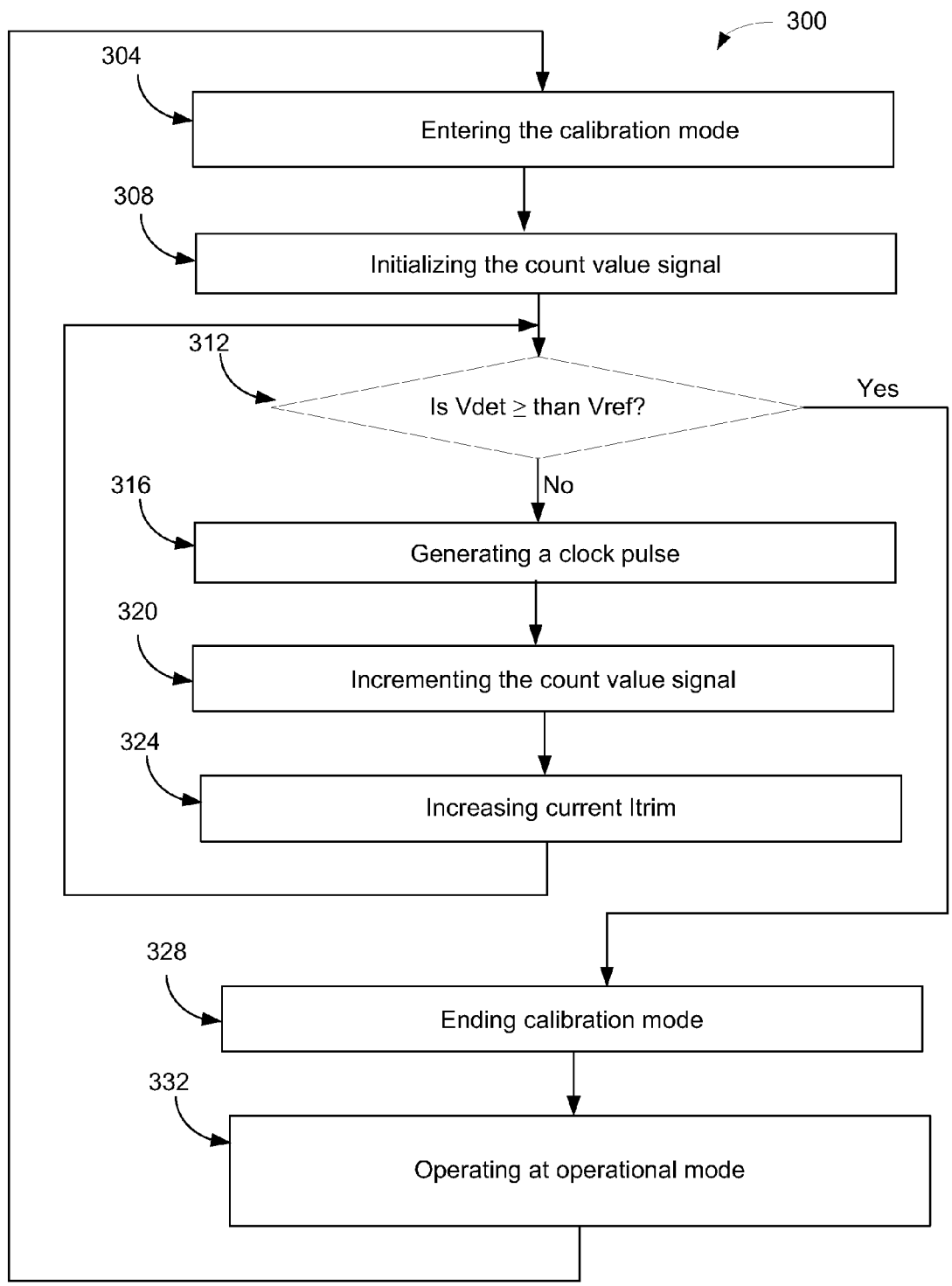
FIG. 3 illustrates a method for operating the system of FIG. 2, in accordance with various embodiments of the present disclosure.

FIG. 3 illustrates a method 300 for operating the system 200 of FIG. 2, in accordance with various embodiments of the present disclosure. Referring to FIG. 3, at 304 ("Entering the calibration mode"), the system 200 enters the calibration mode by, for example, enabling the enable signal of FIG. 2. For example, during a first period of time, the antenna structure 108 may refrain from transmitting radio frequency communication signals, and the system may enter the calibration mode during this first period of time.

At 308 ("Initializing the count value signal"), the calibration controller 236 initializes the count value signal 260. For example, the calibration controller 236 may reset the counter 250 such that the count value signal 260 is initialized to 000. As illustrated in Table 1, when the count value signal 260 is equal to 000, the current sources 254a, ..., 254c are switched OFF, and Itrim is equal to zero. At this time, Vdet is generated by the CVC 124 due to the current Idet only.

The method further comprises, at 312 ("Is Vdet≧Vref?"), determining whether Vdet is equal to or greater than Vref. For example, as previously discussed, the comparator 238 may compare Vdet with Vref. The output Vdif of the comparator 238 may be high if Vdet<Vref, and Vdif may be low if Vdet≧Vref. Thus, the determination at 312 may be performed by determining if Vdif is low.

In case the determination at 312 is negative, e.g., if Vdet<Vref, then Vdif may be high, as previously discussed. Also, as the system is in calibration mode, the enable signal may also be high. Accordingly, as previously discussed, the output of the calibration enable module 242 may be low. As a result, at 316 ("Generating a clock pulse"), the clock generation module 242 may generate a clock pulse of the clock signal.

At 320 ("Incrementing the count value signal"), the counter 250 may increment the count value signal 260, e.g., increment the count value signal 260 by one, based at least in part on generating the clock pulse at 316. For example, the count value signal 260 may now be equal to 001.

At 324 ("Increasing current Itrim"), the current source module 254 in the calibration unit 232 may increase the current Itrim based at least in part on incrementing the count value signal 260 at 320. For example, as discussed with respect to Table 1, for a value of 001 of the count value signal 260, current source 254a is switched ON, thereby increasing the current Itrim from 0 to Itrim0.

The incremental increase in the current Itrim at 324 may cause a corresponding increase in voltage Vdet. The operations at blocks 312, ..., 324 may be repeated until at 312, it is determined that Vdet≧Vref. In case Vdet≧Vref, e.g., "Yes" at 312, the signal Vdif may be high. Once Vdif is high, output of the calibration enable module 242 may be low, as previously discussed. Such low value of the calibration enable module 242 may disable the clock generation module 246, thereby ending generation of the clock pulses, ending further increments of the counter 250, and ending further increase in the current Itrim. Accordingly, based upon determining, at 312, that Vdet≧Vref, e.g., "Yes" at 312, the calibration mode may end at 328 ("Ending calibration mode").

At 332 ("Operating at operational mode"), the system 200 may enter and operate at the operational mode in which, for example, the system 200 may transmit, via antenna structure 208, RF communication signals. In various embodiments, during the operational mode, the values of the count value signal 260 and Itrim may be preserved from the calibration mode. That is, during the operational mode, the values of the count value signal 260 and Itrim may be equal to the respective values at the end of the calibration mode.

For example, if at the end of the calibration mode the count value signal 260 is 110, then switches 256b and 256c may be ON, the corresponding current sources 254b and 254c may be enabled, and the corresponding Itrim may be equal to about 6 times Itrim0, as illustrated in Table 1. During the operational mode, the count value signal 260 may also be 110 and the corresponding Itrim may also be equal to 6 times Itrim0 (e.g., the switches 256b and 256c may remain switched ON, and the corresponding current sources 254b and 254c may remain enabled during the operational mode).

In various embodiments, after operating in the operational mode (e.g., after transmitting one or more bursts of RF communication signals), the system 200 may re-enter the calibration mode at 304.

Figure 4:
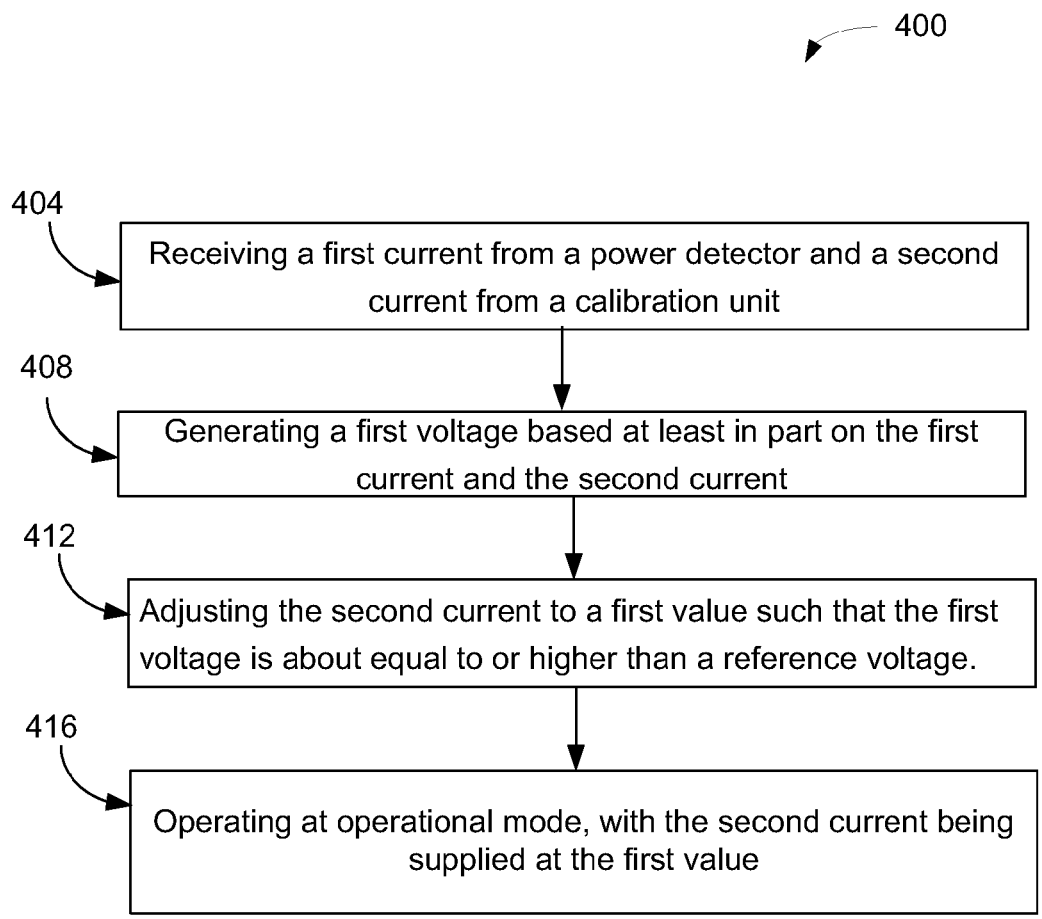
FIG. 4 illustrates a method for operating the systems of FIGS. 1 and/or 2, in accordance with various embodiments of the present disclosure.

FIG. 4 illustrates a method 400 for operating the systems 100 and/200 of FIGS. 1 and/or 2, in accordance with various embodiments of the present disclosure. Referring to FIG. 4, at 404 ("Receiving a first current from a power detector and a second current from a calibration unit"), the CVC 124 receives a first current Idet from power detector 120 and a second current Itrim from calibration unit 132 and/or 232 of FIGS. 1 and/or 2.

At 408 ("Generating a first voltage based at least in part on the first current and the second current"), the CVC 124 generates a first voltage Vdet based at least in part on the first current Idet and the second current Itrim.

At 412 ("Adjusting the second current to a first value such that the first voltage is about equal to or higher than a reference voltage"), the calibration unit adjusts, e.g., increments, while the system is in calibration mode, the second current Itrim to a first value such that the first voltage is about equal to or higher than reference voltage Vref for the first value of the second current Itrim.

At 416 ("Operating at operational mode, with the second current being supplied at the first value"), the system operates at operational mode. During the operational mode, the calibration unit may continue supplying the second current Itrim at the first value.

Unlike some conventional calibration systems, the calibration module 230 may not need a dedicated external clock, fuses or a serial peripheral interface for calibrating the systems 100 and/or 200, for adjusting the trim current Itrim, and/or for preserving the value of the current Itrim from the calibration mode to the operational mode. Also, the calibration performed by the calibration module 130 and/or 230 may be valid over wide ranges of temperature, battery unit charge level, and/or process variations. For example, as temperature or battery charge level changes, the calibration module may adjust the current Itrim to compensate for temperature-induced errors, battery charge level-induced errors, process variations, and/or the like. Also, in various embodiments, the calibration module may be integrated in a chip that also includes the power detector 120 and/or the CVC 124, thereby eliminating additional pads or pins required for the calibration process.

Figure 5:
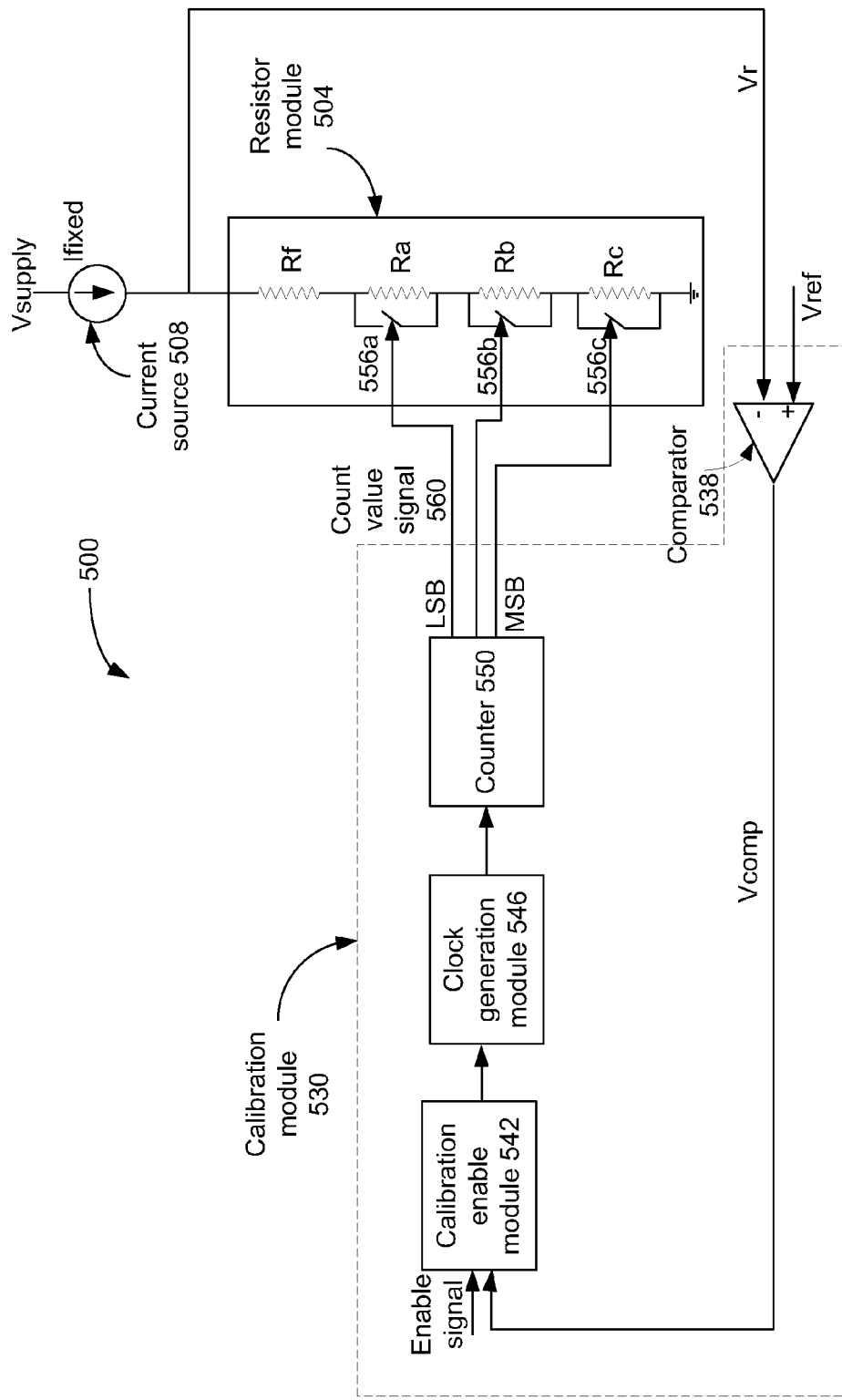
FIG. 5 illustrates a system that includes a calibration module for calibrating a resistor module, in accordance with various embodiments of the present disclosure.

In various embodiments, the inventive principles of this disclosure may be applied to calibrate, apart from the power detector 120 and/or the CVC 124, various other types of circuits as well. For example, FIG. 5 illustrates a system 500, which includes a calibration module 530, illustrated by dotted line, for calibrating a resistor module 504, in accordance with various embodiments of the present disclosure.

In various embodiments, the resistor module 504 includes a series of resistor Rf and Ra, ..., Rc. Resistors Ra, ..., Rc may be selectively shorted by the calibration module 530 through respective switches 556a, ..., 556c. A fixed current source 508 may supply a constant current Ifixed to the resistor module 504. A voltage Vr, generated across the resistor module 504, may be fed back to the calibration module 530.

In various embodiments, a number of resistors (e.g., resistors Ra, ..., Rc), which are controlled by the calibration module 530, may be equal to a number of bits in a count value signal 560 that is output by the calibration module 530. Although only three such resistors Ra, ..., Rc are illustrated in FIG. 5, in various other embodiments, any other number of such resistors may be included in the resistor module 504.

In various embodiments, it may be desirable to have a resistance of the resistor module 504 to be equal to a reference resistance Rref. For the resistance value Rref, for the current Ifixed, and under pre-defined operating conditions, the voltage generated across the resistor module 504 may be equal to a reference voltage Vref. However, because of variations in the operating conditions and/or process variations, the resistance of the resistor module 504 may deviate from Rref. Accordingly, the voltage Vr across the resistor module 504 may also deviate from the reference voltage Vref. Accordingly, it may be desirable to adjust the resistors Ra, . . . , Rc, e.g., by selectively shorting one or more of the resistors Ra, . . . , Rc, using the calibration module 530, such that the resistance of the resistor module 504 is substantially equal to Rref, which may correspond to the voltage Vr being substantially equal to the reference voltage Vref.

In various embodiments, the calibration module 530 may include a comparator 538 to compare Vr with the reference voltage Vref to generate a comparison signal Vcomp. In various embodiments, the comparison signal Vcomp may be may be high if Vr<Vref and low if Vr≧Vref.

The calibration module 530 may also include a calibration enable module 542 configured to receive the Vcomp signal and an enable signal. The enable signal may be enabled, e.g., the enable signal is high, when the system 500 is in a calibration mode. The calibration enable module 542 is operatively coupled to a clock generation module 546. The clock generation module 546 is configured to generate a clock signal based at least in part on an output of the calibration enable module 542. For example, if the output of the calibration enable module 542 is high, the clock generation module 546 may generate the clock signal. On the other hand, if the output of the calibration enable module 542 is low, the clock generation module 546 may be disabled, e.g., the clock generation module 546 may not generate any clock signal.

In various embodiments, in case the enable signal is enabled, i.e., the enable signal is high, and if Vcomp is high, e.g., when Vr<Vref, the output of the calibration enable module 542 is low. As previously discussed, such a low output of the calibration enable module 542 enables the clock generation module 546 to generate the clock signal.

On the other hand, in case the enable signal is disabled or if Vcomp is low, e.g., when Vr is equal to or greater than Vref, the output of the calibration enable module 542 may be high. As previously discussed, such a high output of the calibration enable module 542 disables the clock generation module 546.

In various embodiments, the calibration enable module 542 may be a NAND logic gate.

In various embodiments, the clock generation module 546 is operatively coupled to a counter 550. The counter 550 may be, for example, a ripple counter, although any other appropriate type of counter may also be used. During the calibration mode, the counter 550 may increment a count value signal 560 based at least in part on the clock generation module 546 generating the clock signal. For example, the counter 550 may increment the count value signal 560 by one for each clock pulse of the clock signal generated by the clock generation module 546.

In various embodiments, the resistors Ra, . . . , Rc may be binary weighted resistors. For example, Ra may be equal to $2^0$ (e.g., 1) times an example resistance R0, Rb may be equal to $2^1$ (e.g., 2) times R0, and Rc may be equal to $2^2$ (e.g., 4) times R0.

In various embodiments, the count value signal 560 may be an N-bit signal, e.g., for system 500, N=3, wherein each bit of the count value signal 560 may control switching of respective switches 556a, . . . , 556c, and may control selective shorting of respective resistors Ra, . . . , Rc. For example, the LSB of the count value signal 560 may control selective shorting of Ra, MSB of the count value signal 560 may control selective shorting of Rc, and the middle bit of the count value signal 560 may control selective shorting of Rb.

In various embodiments, when a bit of the count value signal 560 is low, the corresponding switch may be switched ON, resulting in the corresponding resistor being shorted. In various embodiments, when a bit of the count value signal 560 is high, the corresponding switch may be switched OFF, resulting in the corresponding resistor being in series with the resistor Rf. For example, when the count value signal 560 is 010, Ra and Rc are shorted, and Rb, which is equal to 2 times R0, is in series with Rf. In another example, when the count value signal 560 is 100, Ra and Rb are shorted, and Rc (which is equal to 4 times R0) is in series with Rf. In yet another example, when the count value signal 560 is 110, Ra is shorted, and Rb (which is equal to 2 times R0) and Rc (which is equal to 4 times R0) is in series with Rf. Accordingly, the resistance value of the resistor module 504 may increase with an increment in the count value signal 560. As the voltage Vr may be based at least in part on the resistance value of the resistor module 504, in various embodiments, the voltage Vr may also increase with increment in the count value signal 560.

Figure 6:
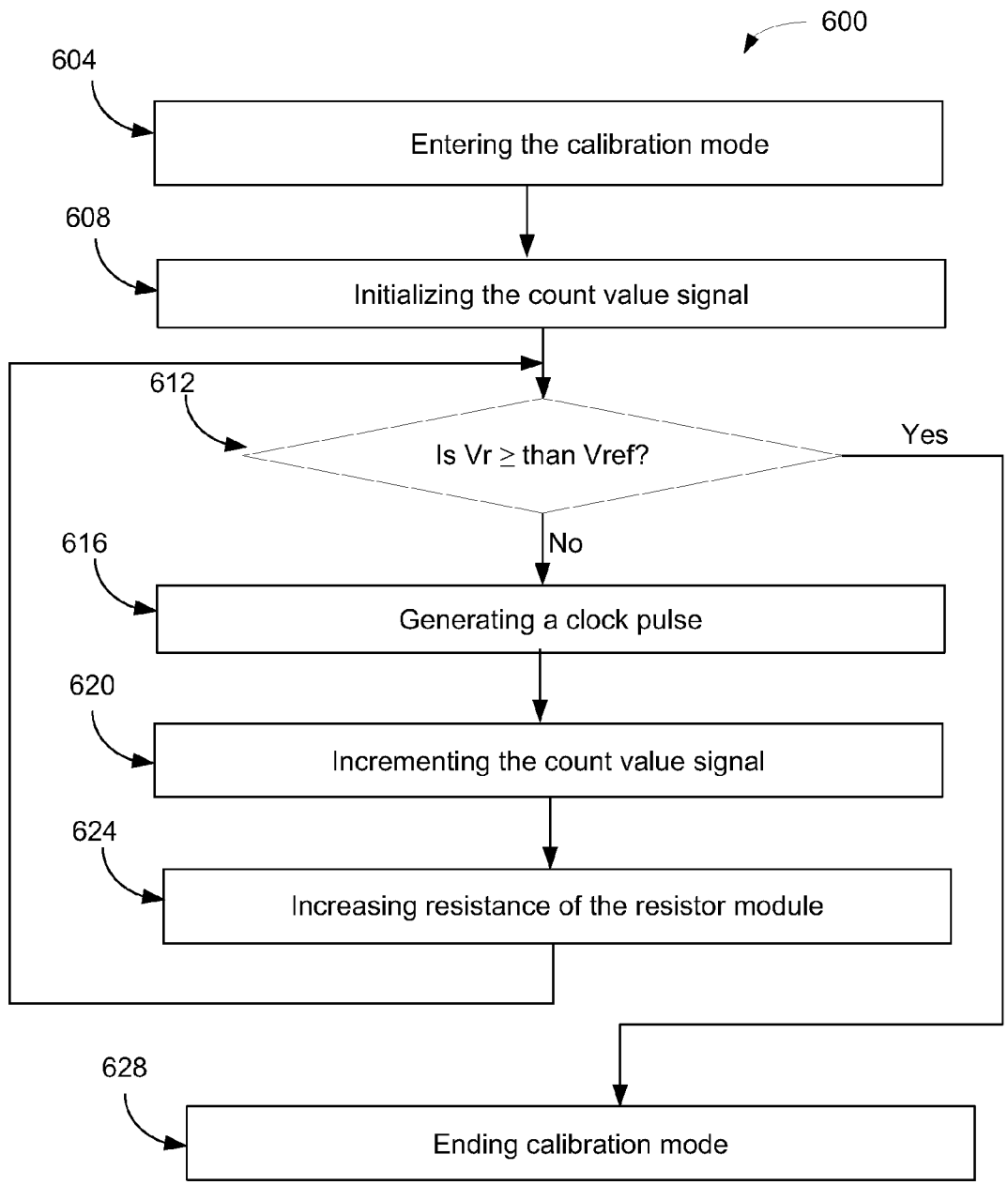
FIG. 6 illustrates a method for operating the system of FIG. 5, in accordance with various embodiments of the present disclosure.

FIG. 6 illustrates a method 600 for operating the system 500 of FIG. 5, in accordance with various embodiments of the present disclosure. Referring to FIG. 6, at 604 ("Entering the calibration mode"), the system 500 enters the calibration mode by, for example, enabling the enable signal of FIG. 5. The system 500 may enter the calibration mode, for example, when the system 500 desires to calibrate, or re-calibrate, the resistor module 504.

At 608 ("Initializing the count value signal"), the calibration module 530 initializes the count value signal 560. For example, the calibration module 530 may reset the counter 550 such that the count value signal 560 is initialized to 000. As previously discussed, when the count value signal 560 is equal to 000, the switches 556a, . . . , 556c are switched ON, resulting in shorting of Ra, Rb and Rc. At this time, Vr is generated due to Rf only.

The method further comprises, at 612 ("Is Vr≧Vref?"), determining whether Vr is equal to or greater than Vref. For example, as previously discussed, the comparator 538 may compare Vr with Vref. The output Vcomp of the comparator 538 may be high if Vr<Vref, and Vcomp may be low if Vr≧Vref. Thus, the determination at 612 may be performed by determining if Vcomp is low.

In case the determination at 612 is negative, e.g., if Vr<Vref, then Vcomp may be high, as previously discussed. Also, as the system is in calibration mode, the enable signal may also be high. Accordingly, as previously discussed, the output of the calibration enable module 542 may be low. As a result, at 616 ("Generating a clock pulse"), the clock generation module 542 may generate a clock pulse signal.

At 620 ("Incrementing the count value signal"), the counter 550 may increment the count value signal 560, e.g., increment the count value signal 560 by one, based at least in part on generating the clock pulse at 616. For example, the count value signal 660 may now be equal to 001, in case the count value signal 560 is a 3 bit binary signal.

At 624 ("Increasing resistance of the resistor module"), the resistance of the resistor module 504 may increase because of, for example, the resistor Ra coming in series with Rf for a 001 value of the count value signal 560, as previously discussed.

Because of the incremental increase in the resistance of the resistor module 504, the voltage Vr may also increase. The operations at blocks 612, . . . , 624 may be repeated until at 612, it is determined that Vr≧Vref. In case Vr≧Vref, e.g., "Yes" at 612, the signal Vcomp may be low. Once Vcomp is low, output of the calibration enable module 542 may be low, as previously discussed. Such low value of the calibration enable module 542 may disable the clock generation module 546, thereby ending generation of the clock pulses, ending further increments of the counter 550, and ending further increase in the resistance of the resistor module 504.

Accordingly, based upon determining, at 612, that Vr≧Vref (e.g., "Yes" at 612), the calibration mode may end at 628 ("Ending calibration mode").

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A method comprising:
    receiving, by a current-to-voltage convertor, a first current from a power detector and a second current from a calibration unit;
    generating, by the current-to-voltage convertor, a first voltage based at least in part on the first current and the second current; and
    adjusting, by a calibration controller during a calibration mode, the second current based at least in part on a reference voltage, the adjusting including:
        initializing, at the beginning of the calibration mode, a count value signal;
        generating, during the calibration mode, one or more clock pulses until the first voltage is about equal to the reference voltage;
        incrementing the count value signal in response to generating the one or more clock pulses; and
        increasing the second current in response to incrementing the count value signal.

2. The method of claim 1, wherein adjusting the second current further comprises:
    adjusting the second current to a first value such that the first voltage is about equal to the reference voltage for the first value of the second current.

3. The method of claim 2, further comprising:
    generating, by the calibration unit during at least a portion of an operational mode, the second current at the first value, wherein the operational mode follows the calibration mode.

4. The method of claim 1, wherein incrementing the count value signal further comprises:
    incrementing the count value signal by one corresponding to generation of each clock pulse.

5. The method of claim 1, wherein increasing the second current further comprises:
    increasing the second current proportional to incrementing the count value signal.

6. A method comprising:
    receiving, by a current-to-voltage convertor, a first current from a power detector and a second current from a calibration unit;
    generating, by the current-to-voltage convertor, a first voltage based at least in part on the first current and the second current;
    adjusting, by a calibration controller during a calibration mode, the second current based at least in part on a reference voltage;
    refraining from transmitting radio frequency communication signals during a first period of time; and
    operating in the calibration mode during the first period of time.

7. The method of claim 6, wherein adjusting the second current further comprises:
    adjusting the second current to a first value such that the first voltage is about equal to the reference voltage for the first value of the second current.

8. The method of claim 7, further comprising:
    generating, by the calibration unit during at least a portion of an operational mode, the second current at the first value, wherein the operational mode follows the calibration mode.

9. A circuit comprising:
    a power detector configured to output a first current;
    a calibration unit configured to output a second current;
    a current-to-voltage convertor operatively coupled with the power detector and the calibration unit, the current-to-voltage convertor configured to receive the first current and the second current, and to output a first voltage based at least in part on the first current and the second current; and
    a calibration controller operatively coupled with the calibration unit and configured to adjust the calibration unit, while the device is in a calibration mode, such that the first voltage is substantially equal to a reference voltage;
    wherein the power detector is configured to detect power of radio frequency (RF) communication signals transmitted by an antenna structure; and
    wherein the antenna structure does not transmit RF communication signals while in the calibration mode.

10. The circuit of claim 9,
    wherein the calibration unit comprises a current source module that is coupled with, and controlled by, the calibration controller, and wherein the current source module is configured to output the second current; and
    wherein the calibration controller is configured to control the current source module to adjust, while the device is in the calibration mode, the second current to a first value such that the first voltage is substantially equal to the reference voltage for the first value of the second current.

11. The circuit of claim 10,
    wherein the calibration unit is further configured to output the second current at the first value while the device is in an operational mode that immediately follows the calibration mode.

12. A circuit comprising,
    a power detector configured to output a first current;
    a calibration unit configured to output a second current;
    a current-to-voltage convertor operatively coupled with the power detector and the calibration unit, the current-to-voltage convertor configured to receive the first current and the second current, and to output a first voltage based at least in part on the first current and the second current; and
    a calibration controller operatively coupled with the calibration unit and configured to adjust the calibration unit, while the device is in a calibration mode, such that the first voltage is substantially equal to a reference voltage;

wherein the calibration unit comprises a current source module that is coupled with, and controlled by, the calibration controller, and wherein the current source module is configured to output the second current;

wherein the calibration controller comprises a clock generation module and a counter, wherein the counter is configured to output a N bit count value signal; and wherein the current source module comprises N binary weighted current sources, with each of the N binary weighted current sources being controlled by a corresponding bit of the count value signal.

13. The circuit of claim 12, wherein the calibration unit is configured to output the second current such that the second current is proportional to the count value signal.

14. The circuit of claim 12, wherein the clock generation module is configured to generate, during the calibration mode, one or more clock pulses until the first voltage is substantially equal to the reference voltage; and wherein the count value signal is incremented by one corresponding to each clock pulse being generated by the clock generation module.

15. The circuit of claim 14, wherein the calibration unit is configured to increase the second current proportional to the increment of the count value signal.

16. The circuit of claim 12, wherein the counter is configured to initialize the count value signal at a beginning of the calibration mode.

17. A system comprising:

a resistor module comprising N resistors, where N is an integer; and a calibration module configured to selectively short one or more of the N resistors such that an output voltage of the resistor module is substantially equal to a reference voltage, wherein the calibration module includes:

a clock generator to generate one or more clock pulses until the output voltage is substantially equal to the reference voltage; and a counter configured to output an N-bit count value signal such that each bit of N-bit count value signal selectively shorts a corresponding resistor of the N resistors, wherein the counter is further configured to increment the count value signal by one corresponding to each clock pulse being generated by the clock generator.

18. The system of claim 17, wherein the calibration module further comprises:

a comparator configured to output a comparison signal based at least in part on a comparison of the output voltage and the reference voltage, wherein the clock generator is configured to generate the one or more clock pulses based at least in part on the comparison signal.

19. The system of claim 17, wherein the N resistors are binary weighted resistors.

20. The system of claim 17, wherein the counter is a ripple counter. at the first value, wherein the operational mode follows the calibration mode.

* * * * *

UNITED STATES PATENT AND TRADEMARK OFFICE
CERTIFICATE OF CORRECTION

PATENT NO.         : 8,310,224 B2
APPLICATION NO.    : 12/699829
DATED              : November 13, 2012
INVENTOR(S)        : Kiran Karnik It is certified that error appears in the above-identified patent and that said Letters Patent is hereby corrected as shown below:

In the Claims:

In claim 20, col. 14, lines 27-28, "...counter. at the first value, wherein the operational mode follows the calibration mode." should read – "...counter."

Signed and Sealed this
Fifteenth Day of July, 2014

Michelle K. Lee
*Deputy Director of the United States Patent and Trademark Office*